(12) United States Patent
Kalnitsky et al.

(10) Patent No.: US 6,362,050 B2
(45) Date of Patent: Mar. 26, 2002

(54) METHOD FOR FORMING A NON-VOLATILE MEMORY CELL THAT ELIMINATES SUBSTRATE TRENCHING

(75) Inventors: Alexander Kalnitsky, San Francisco; Albert Bergemont, Palo Alto, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/732,381

(22) Filed: Dec. 7, 2000

Related U.S. Application Data (62) Division of application No. 09/118,574, filed on Jul. 17, 1998, now Pat. No. 6,184,552.

(51) Int. Cl.$^7$ ...................... H01L 21/336; H01L 29/788
(52) U.S. Cl. ........................ 438/258; 438/261; 438/263; 438/264; 257/315; 257/316
(58) Field of Search ................... 438/266, 258, 438/261, 264, 211, 201, 981, 251

(56) References Cited

U.S. PATENT DOCUMENTS

| 4,426,764 A | * | 1/1984 | Kosa et al. ................... 29/571 |
| 4,495,693 A | * | 1/1985 | Iwahashi et al. ............... 29/571 |
| 5,326,999 A | | 7/1994 | Kim et al. ................... 275/315 |

FOREIGN PATENT DOCUMENTS

| EP | 0779646 A1 | * | 6/1997 |

* cited by examiner

*Primary Examiner*—Eddie Lee
*Assistant Examiner*—Paul E Brock, II
(74) *Attorney, Agent, or Firm*—Pillsbury Winthrop LLP (57) ABSTRACT

In a non-volatile memory cell that has a select transistor and a memory transistor, the substrate trenching that occurs when the gate of the select transistor and the stacked gate of the memory transistor are initially defined is eliminated by forming the gate of the select transistor and the stacked gate of the memory transistor to have substantially the same step height.

17 Claims, 7 Drawing Sheets

METHOD FOR FORMING A NON-VOLATILE MEMORY CELL THAT ELIMINATES SUBSTRATE TRENCHING

This is a divisional of application No. 09/118,574, filed Jul. 17, 1998 now U.S. Pat. No. 6,184,552.

BACKGROUND OF THE INVENTION

1. Field of the Invention

The present invention relates to a method for forming a non-volatile memory cell and, more particularly, to a method for forming a non-volatile memory cell, which has a select transistor and a memory transistor, that eliminates substrate trenching during the etch step that initially defines the gate of the select transistor and the stacked gate of the memory transistor.

2. Description of the Related Art

A non-volatile memory cell is a semiconductor device that stores information even after power has been removed from the device. Two of the most common types of non-volatile memory cells are electrically-erasable programmable read-only-memory (EEPROM) cells and flash memory cells.

Historically, EEPROM cells differed from flash memory cells in that EEPROM cells utilize a select transistor to isolate the memory transistor from the drain line. Flash cells, on the other hand, do not use a select transistor. As a result, the memory transistor of a flash cell is directly connected to the drain line.

In addition, EEPROM cells typically have a thick layer of gate oxide which is formed over the channel regions of the select and memory transistors, and a thin layer of tunnel oxide which is formed over the drain region of the memory transistor. In contrast, the memory transistor in a flash cell typically has a thin layer of tunnel oxide which is formed over the entire channel region.

Figure 1:
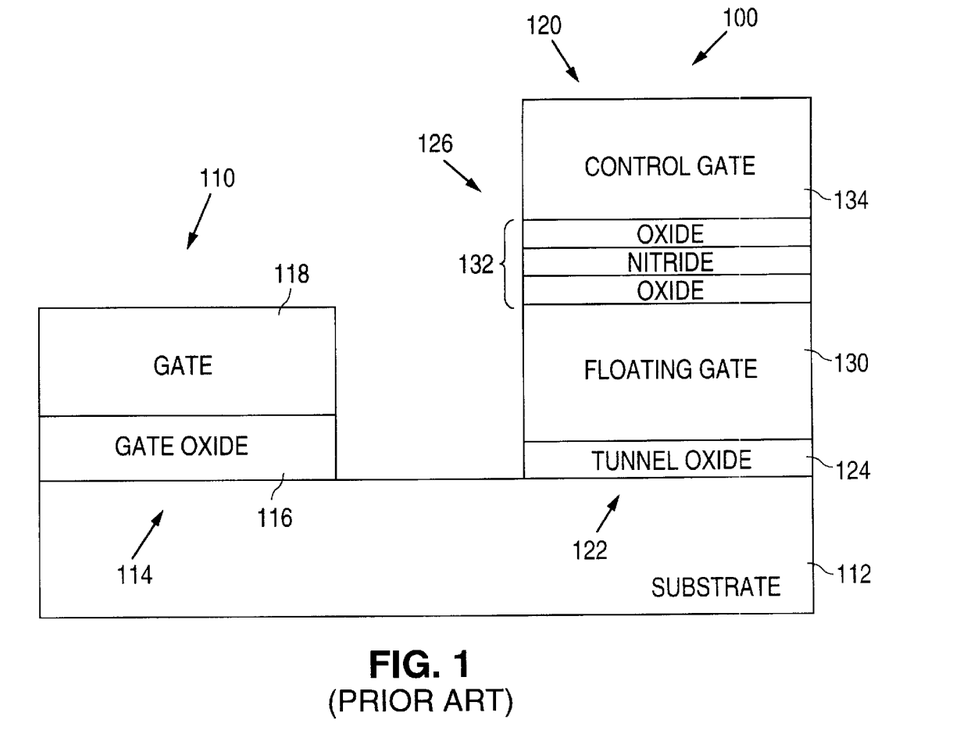
FIG. 1 is a cross-sectional diagram illustrating a conventional hybrid memory cell 100.

More recently, however, these distinctions have become blurred with the fabrication of hybrid memory cells which utilize an EEPROM select transistor in combination with a flash memory transistor. FIG. 1 shows a cross-sectional diagram that illustrates a conventional hybrid memory cell 100.

As shown in FIG. 1, cell 100 includes an EEPROM select transistor 110 and a flash memory transistor 120 which are both formed on a substrate 112. As further shown in FIG. 1, select transistor 110 includes a channel region 114 which is defined in substrate 112, a thick layer of gate oxide 116 which is formed over channel region 114, and a gate 118 which is formed over gate oxide layer 116.

Flash memory transistor 120, in turn, includes a channel region 122 which is defined in substrate 112, and a thin layer of tunnel oxide 124 which is formed over channel region 122. In addition, memory transistor 120 also includes a stacked gate 126 that has a floating gate 130 which is formed on oxide layer 124, an oxide-nitride-oxide (ONO) interpoly dielectric 132 which is formed on gate 130, and a control gate 134 which is formed on interpoly dielectric 132.

One problem with cell 100 is that it is difficult to fabricate a cell which has two different oxide thicknesses, thick gate oxide layer 116 and thin tunnel oxide layer 124, without severely trenching substrate 112 during the etch step that initially defines gate 118 of select transistor 110 and stacked gate 126 of flash memory transistor 120.

Figure 2A:
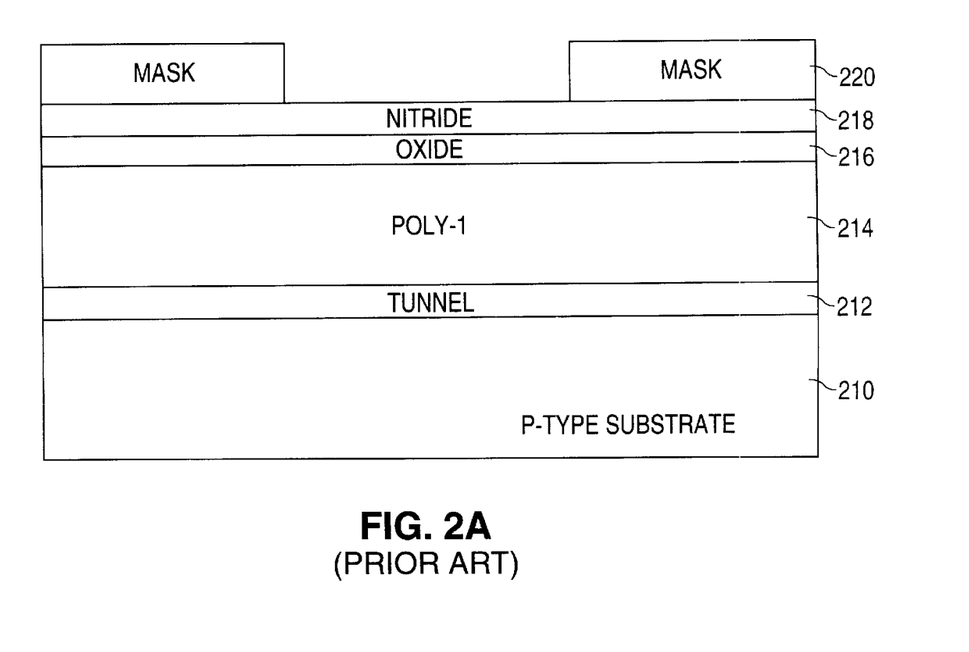
FIGS. 2A–2D are cross-sectional drawings illustrating a conventional process for forming hybrid cell 100.

FIGS. 2A–2D show cross-sectional drawings that illustrate a conventional process for forming hybrid cell 100. As shown in FIG. 2A, the prior art process, which is described with respect to a 0.25-micron photolithographic process, begins with the formation of a layer of tunnel oxide 212 on a p-type substrate 210. Next, a first layer of polysilicon (poly-1) 214 is formed on tunnel oxide layer 212. Poly-1 layer 214, which is utilized to form floating gate 130, is then doped.

Once poly-1 layer 214 has been formed and doped, a first layer of oxide 216 is formed over poly-1 layer 214, followed by the deposition of an overlying layer of nitride 218. Oxide layer 216 and nitride layer 218 form the first two layers of interpoly dielectric 132.

Next, a first mask 220 is formed and patterned on nitride layer 218 to define an unmasked area on the surface of nitride layer 218. The unmasked area, in turn, defines an etch area on the surface of tunnel oxide layer 212.

Figure 2B:
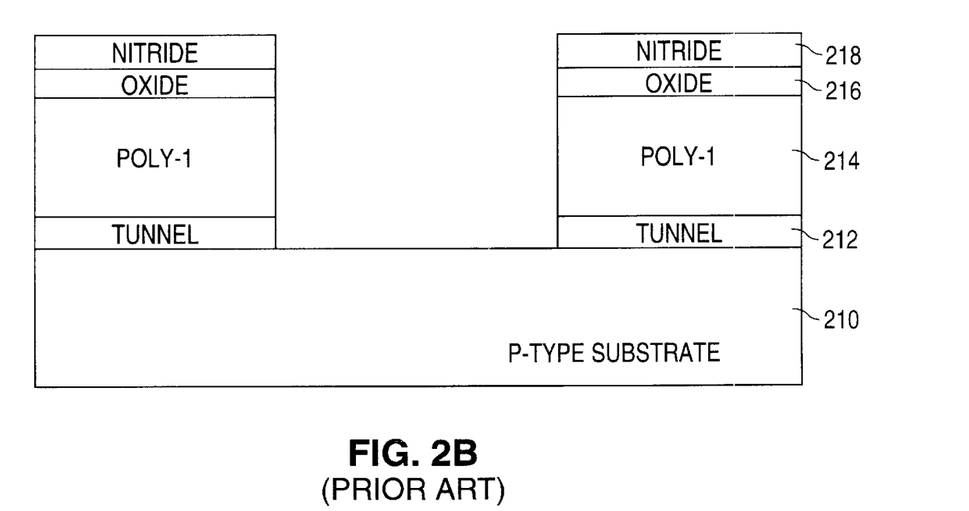

After this, as shown in FIG. 2B, the unmasked areas of nitride layer 218, oxide layer 216, and poly-1 layer 214 are anisotropically etched until poly-1 layer 214 has been completely removed from the etch area on the surface of tunnel oxide layer 212. Following the etch, mask 220 is removed, and the portion of tunnel oxide layer 212 that was exposed by the etch is removed by a wet etch.

Figure 2C:
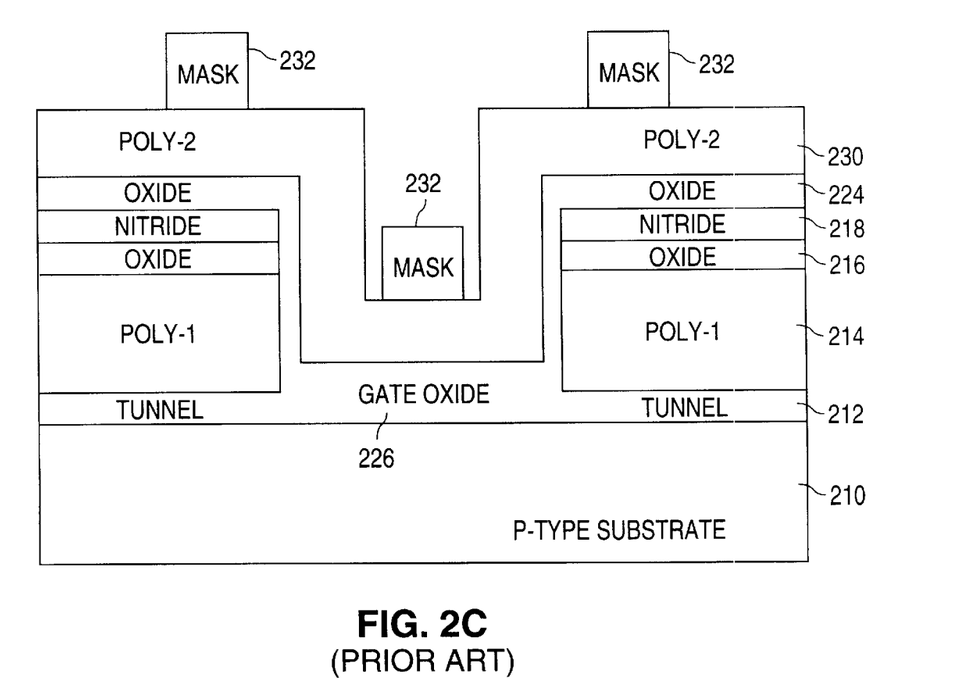

Next, as shown in FIG. 2C, a second layer of oxide 224 is formed over nitride layer 218, substrate 210, and the sidewalls of poly-1 layer 214. Second oxide layer 224 is utilized to form the third layer of interpoly dielectric 132. Following this, a layer of gate oxide 226 is formed over the surface of substrate 210 by thermal oxidation. In addition to forming gate oxide layer 226, the thermal oxidation step also densifies second oxide layer 224, and increases the thickness of the oxide formed on the sidewalls of poly-1 layer 214.

Once gate oxide layer 226 has been formed, a second layer of polysilicon (poly-2) 230 is deposited over oxide layer 224 and gate oxide layer 226. Poly-2 layer 230, which is utilized to form gate 118 and control gate 134, is then doped. (Optionally, a layer of metal silicide may be formed over poly-2 layer 230). Next, a second mask 232 is formed and patterned on poly-2 layer 230 (or the overlying metal silicide layer) to define a plurality of unmasked areas on the surface of poly-2 layer 230 (or the metal silicide layer). The unmasked areas, in turn, define a plurality of etch areas on the surface of tunnel oxide layer 212.

Figure 2D:
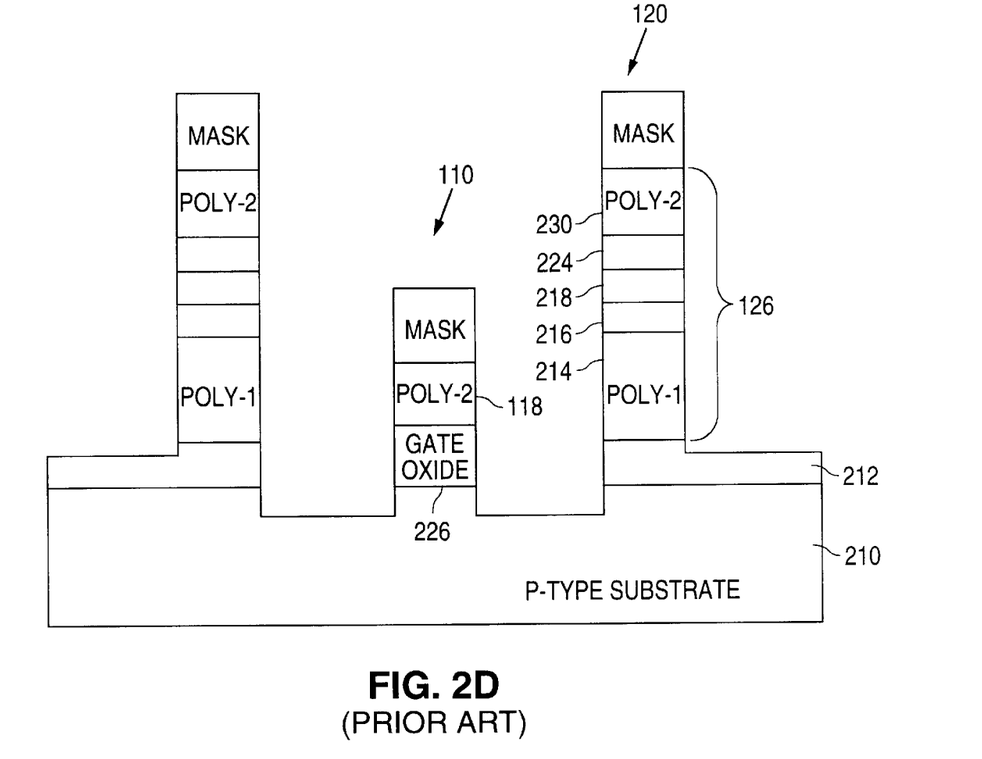

After this, as shown in FIG. 2D, the unmasked areas of poly-2 layer 230, oxide layer 224, nitride layer 218, oxide layer 216, poly-1 layer 214, and gate oxide layer 226 are anisotropically etched until poly-1 layer 214 has been completely removed from the etch areas on the surface of tunnel oxide layer 212.

However, as further shown in FIG. 2D, this etch step, which initially defines gate 118 of select transistor 110 and stacked gate 126 of memory transistor 120, severely trenches substrate 210 due to the differing step heights between transistors 110 and 120. This substrate trenching, in turn, is detrimental to the electrical performance of the memory cell.

Thus, there is a need for a process for forming a non-volatile memory cell that eliminates the substrate trenching that occurs during the etch step that initially defines the gate of the select transistor and the stacked gate of the memory transistor.

SUMMARY OF THE INVENTION

During the conventional fabrication of a non-volatile memory cell that has a select transistor and a memory transistor, the etch step that initially forms the gate of the select transistor and the stacked gate of the memory transistor undesirably etches away a significant portion of the substrate. The method of the present invention eliminates this substrate etching by forming the gate of the select transistor and the stacked gate of the memory transistor to have substantially the same step height. In addition, the step heights of the gate and the stacked gate are formed from a substantially identical combination of films.

The method of the present invention begins by forming a layered structure on a semiconductor material. The layered structure includes a first layer of insulation material which is formed on the semiconductor material, a first layer of conductive material which is formed on the first layer of insulation material, and a first portion of an interpoly dielectric which is formed on the first layer of conductive material.

After this, an opening in the layered structure is formed by removing a first portion of the layered structure. The opening has a width, and exposes the first layer of conductive material. Next, a cavity is formed in the layered structure by removing a second portion of the layered structure. The second portion of the layered structure, in turn, includes a portion of the first layer of conductive material. In addition, the cavity has a width which is greater than the width of the opening.

Following this, a second portion of the interpoly dielectric is formed on the first portion of the interpoly dielectric. Next, a second layer of insulation material is formed on the bottom surface of the cavity. The second layer of insulation material has a thickness such that the distance from the top surface of the semiconductor material to the top surface of the second layer of insulation material is greater than the distance from the top surface of the semiconductor material to the top surface of the first layer of insulation material.

Once the second layer of insulation material has been formed, a second layer of conductive material is formed on the second portion of the interpoly dielectric and the second layer of insulation material. The second layer of conductive material extends through the opening and fills up the cavity. After this, portions of the second layer of conductive material, the second portion of the interpoly dielectric, and the layered structure are selectively removed.

The above process initially forms the gate of a select transistor and the stacked gate of a memory transistor. The stacked gate includes the first layer of insulation material, and a floating gate which is formed on the first layer of insulation material from the first layer of conductive material.

The stacked gate of the memory transistor also includes an interpoly dielectric which is formed on the floating gate from the first and second portions of the interpoly dielectric, and a control gate which is formed on the interpoly dielectric from the second layer to conductive material.

The gate of the select transistor, in turn, includes the second layer of insulation material, and a gate which is formed on the second layer of insulation material from the second layer of conductive material. The gate of the select transistor has sidewalls, and the interpoly dielectric formed in the sidewalls.

A better understanding of the features and advantages of the present invention will be obtained by reference to the following detailed description and accompanying drawings which set forth an illustrative embodiment in which the principals of the invention are utilized.

DETAILED DESCRIPTION

FIGS. 3A–3G show cross-sectional drawings that illustrate a process for forming a non-volatile memory cell, which has a select transistor and memory transistor, in accordance with the present invention. As described in greater detail below, the process of the present invention eliminates substrate trenching by forming the gates of the select transistors and the stacked gates of the memory transistors to have substantially the same step heights.

Figure 3A:
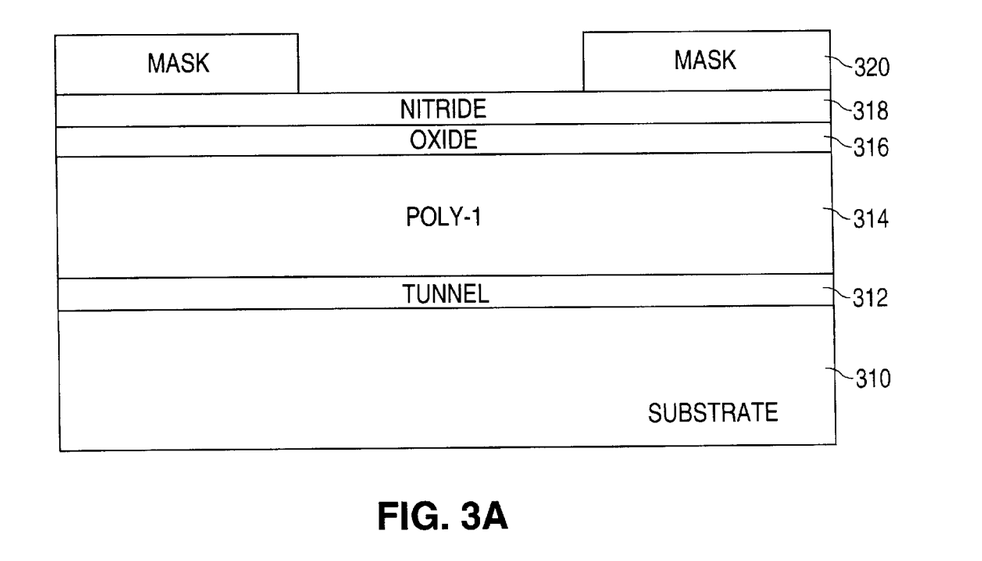
FIGS. 3A–3G are cross-sectional drawings illustrating a process for forming a non-volatile memory cell, which has a select transistor and memory transistor, in accordance with the present invention.

As shown in FIG. 3A, the process of the present invention, which is described with respect to a 0.25-micron photolithographic process, begins with the formation of a layer of tunnel oxide 312 approximately 100 Å thick on a conventionally prepared semiconductor material 310, such as a substrate or a well. Next, a layer of polysilicon (poly-1) 314 approximately 1,000–5,000 Å thick is formed on tunnel oxide layer 312. Poly-1 layer 314, which is utilized to form the floating gates of the memory transistors, is then doped.

Once poly-1 layer 314 has been formed and doped, a first layer of oxide 316 approximately 50–100 Å thick is formed on poly-1 layer 314, followed by the deposition of an overlying layer of nitride 318 approximately 100–300 Å thick. Oxide layer 316 and nitride layer 318 form two of the three layers of an interpoly dielectric of oxide-nitride-oxide (ONO).

Next, a first mask 320 is formed and patterned on nitride layer 318 to define an unmasked area on the surface of nitride layer 318. The unmasked area, in turn, defines a first area on the surface of tunnel oxide layer 312.

Figure 3B:
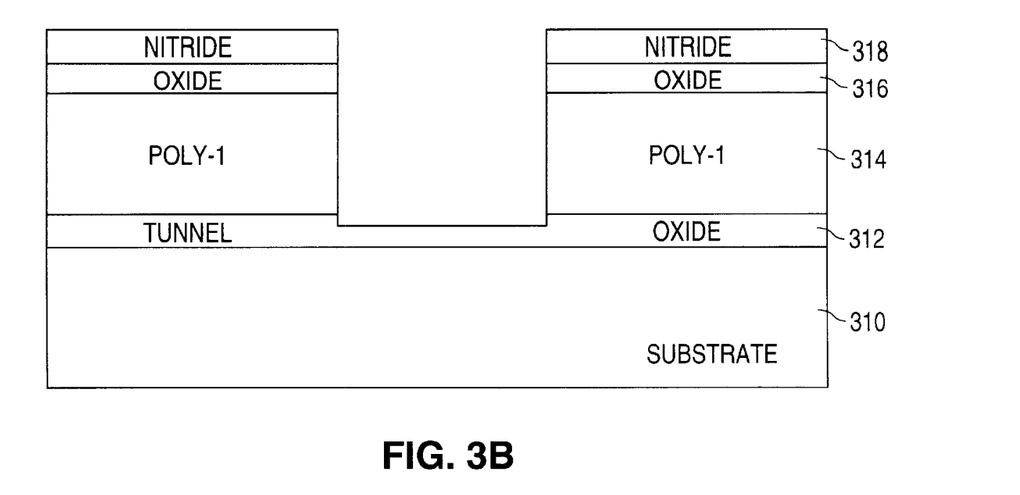

After this, as shown in FIG. 3B, the unmasked areas of nitride layer 318, oxide layer 316, and poly-1 layer 314 are anisotropically etched until poly-1 layer 314 has been completely removed from the first area on the surface of tunnel oxide layer 312. Each of these layers 318, 316, and 314 may be etched with a single etch recipe that includes Ce, Br and F containing species. In addition, to insure that all of the poly-1 has been removed, and as a result of slight variations in the thicknesses of the various layers, tunnel oxide layer 312 is slightly overetched. Following the etch, mask 320 is removed.

Figure 3C:
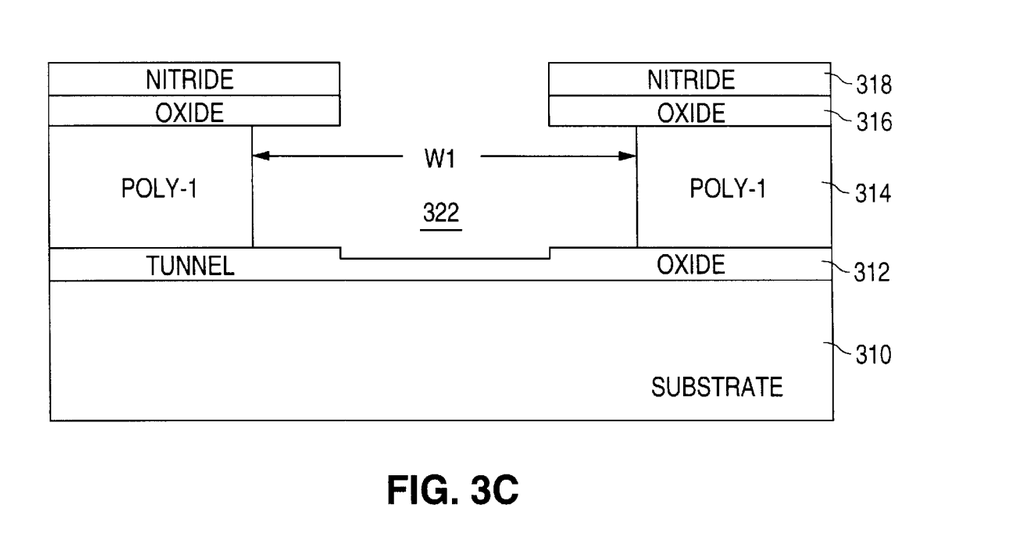

Next, as shown in FIG. 3C, poly-1 layer 314 is laterally etched with a wet etchant that is highly selective to the oxide and nitride layers. This etching step, which forms a cavity 322, continues until cavity 322 has a minimum width W1. Etchants which may be used in this step include KOH, choline, and other similar materials. In addition, an isotropic plasma etch may also be used. Following the etch, a careful DI water rinse is performed to remove the chemical residues that remain following the etch.

Figure 3D:
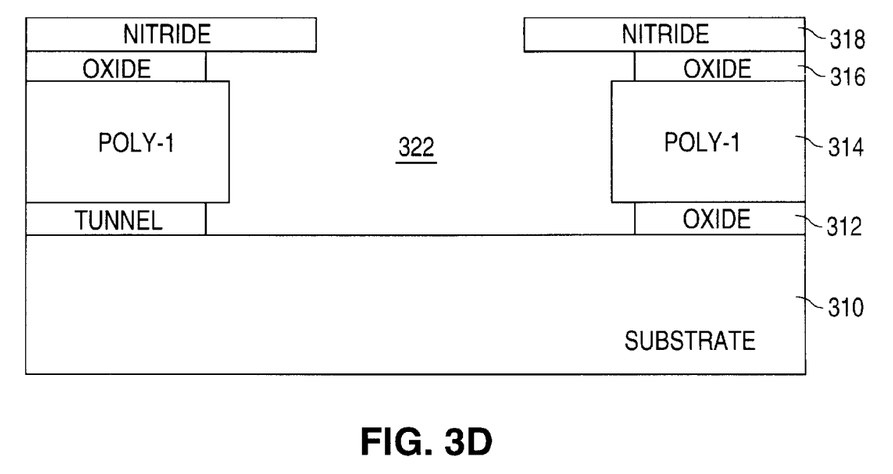

Following this, as shown in FIG. 3D, tunnel oxide layer 314 is removed from a surface region of substrate 310 with a wet etchant that is highly selective to silicon and nitride. Etchants which may be used in this step include HF and HF-containing solutions.

As further shown in FIG. 3D, the wet etch also removes oxide layer 316 from a portion of the underside of nitride layer 318. Following the etch, an HF cleaning is performed.

Figure 3E:
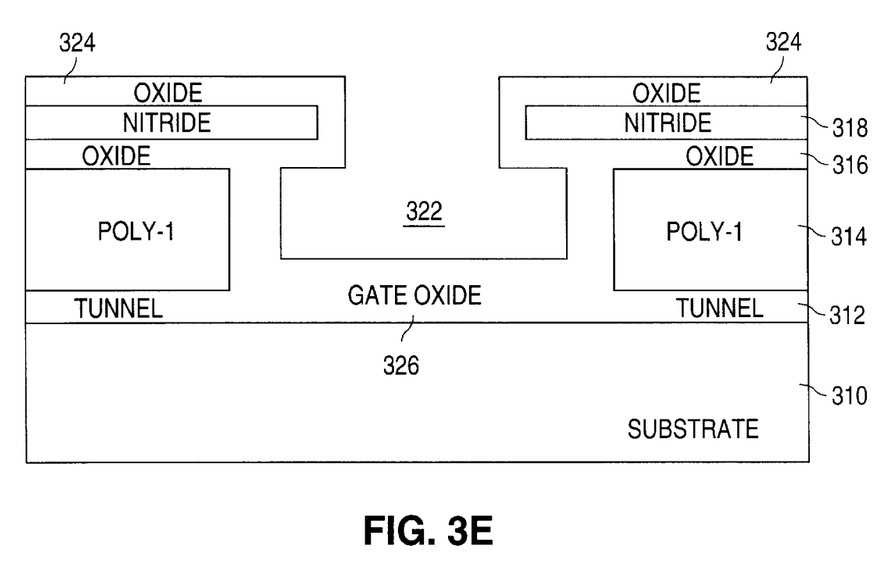

Next, as shown in FIG. 3E, a layer of second oxide 324 approximately 50–100 Å thick is deposited by low-pressure chemical vapor deposition (LPCVD) on the top and bottom surfaces of nitride layer 318, the sidewalls of poly-1 layer 314, and the surface region of substrate 310. Oxide layer 324 forms the third layer of the ONO interpoly dielectric.

Following this, a layer of gate oxide 326 approximately 150–300 Å thick is formed on the surface region of substrate 310 by thermal oxidation. In addition to forming the layer of gate oxide 326, the thermal oxidation step also densifies second oxide layer 324, and increases the thickness of the oxide formed on the sidewalls of poly-1 layer 314.

Figure 3F:
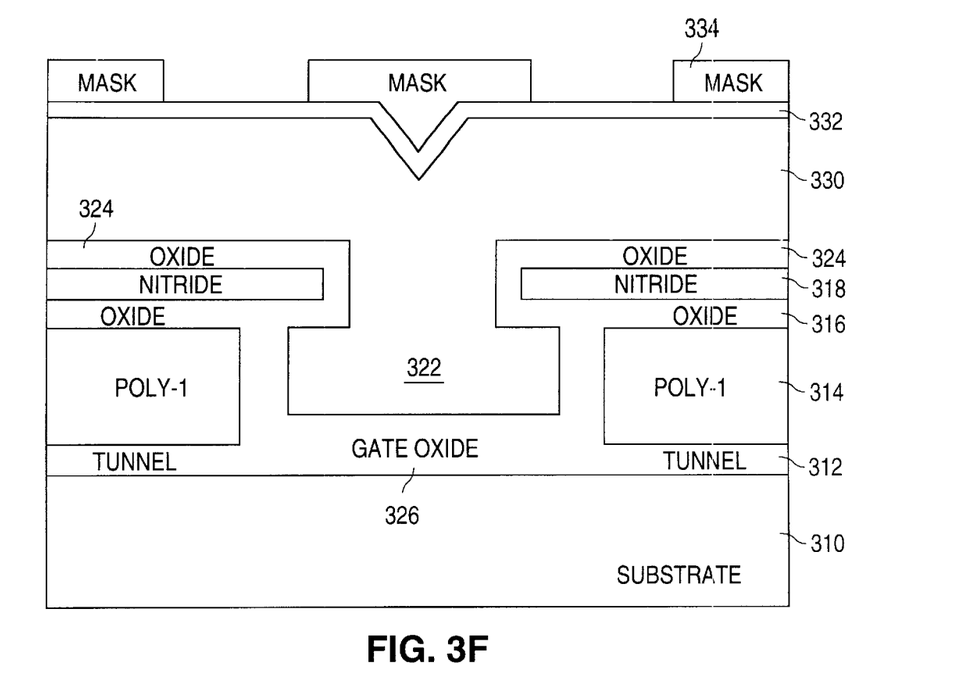

As shown in FIG. 3F, once gate oxide layer 326 has been formed, a second layer of polysilicon (poly-2) 330 approximately 1,000–5,000 Å thick is deposited over oxide layer 324, gate oxide layer 326, and the oxide formed on the sidewalls of poly-1 layer 314 to fill up cavity 322. Poly-2 layer 330, which is used to form the gates of the select transistors and the control gates of the memory transistors, is then doped. Following this, a layer of metal silicide 332 approximately 500–2,000 Å thick is optionally formed over poly-2 layer 330.

Next, a second mask 334 is formed and patterned on silicide layer 332 to define a plurality of unmasked areas on the surface of silicide layer 332 (or poly-2 layer 330 if silicide layer 332 is not used). The unmasked areas, in turn, define a plurality of second areas on the surface of tunnel oxide layer 212.

Figure 3G:
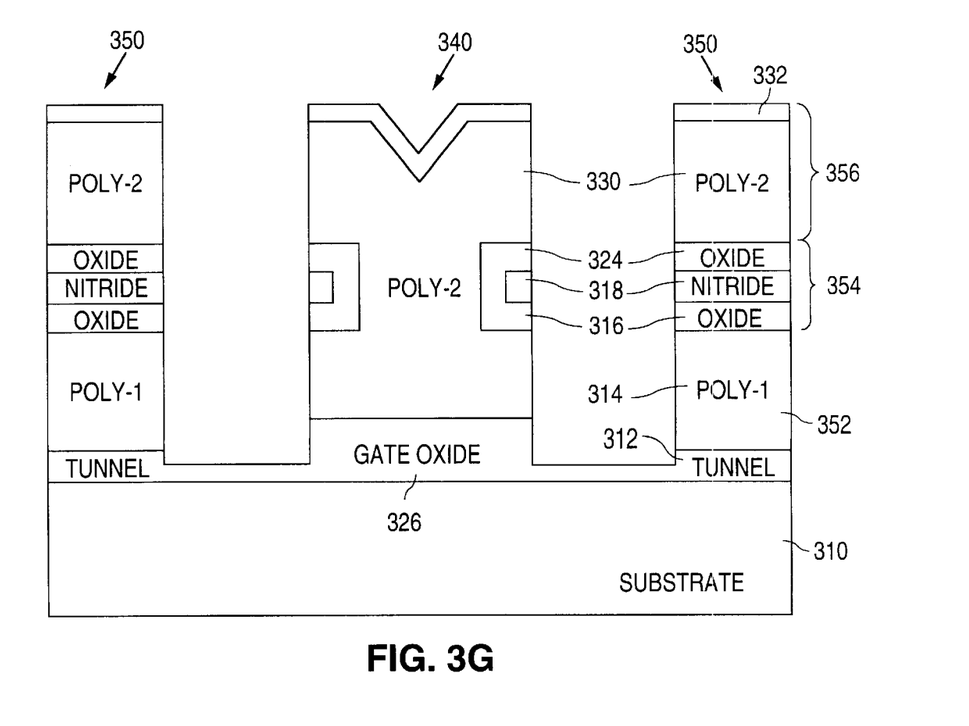

After this, as shown in FIG. 3G, the unmasked areas of silicide layer 332, poly-2 layer 330, oxide layer 324, nitride layer 318, oxide layer 316, poly-1 layer 314, and gate oxide layer 326 are anisotropically etched until poly-1 layer 314 has been completely removed from the second areas on the surface of tunnel oxide layer 312. Like the first etch step, each of these layers 332, 330, 324, 318, 316, 314, and 326 may be etched with a single etch recipe that includes Ce, Br and F. In addition, to insure that all of the poly-1 has been removed, and as a result of slight variations in the thicknesses of the various layers, tunnel oxide layer 312 is slightly overetched.

Following the etch step, mask 334 is removed and the process continues with conventional steps. Thus, as shown in FIG. 3G, a select gate 340 of a select transistor and a stacked gate 350 of a memory transistor are initially defined in the last etch step of the above procedure without etching the substrate.

The stacked gate includes tunnel oxide layer 312 which is formed on semiconductor material 310, and a floating gate 352 which is formed on tunnel oxide layer 312 from doped poly-1 layer 314. Tunnel oxide layer 312 is a first layer of insulation material, while doped poly-1 layer 314 is a first layer of conductive material.

The stacked gate also includes an interpoly dielectric 354 which is formed on floating gate 352 from oxide layer 316, nitride layer 318, and oxide layer 324. Oxide layer 316, nitride layer 318, and oxide layer 324 are a first layer of dielectric material, a second layer of dielectric material, and a third layer of dielectric material, respectively.

The stacked gate further includes a control gate 356 which is formed on interpoly dielectric 354 from doped poly-2 layer 330 and silicide layer 332. Doped poly-2 layer 330 and silicide layer 332 are second and third layers of conductive material, respectively. (Control gate 356 may alternately be formed from only poly-2 layer 330 if the silicide layer is omitted).

The select gate, in turn, includes gate oxide layer 326 which is formed on semiconductor material 310, and a gate which is formed on gate oxide layer 326 from poly-2 layer 330 and silicide layer 332. Gate oxide layer 326 is a second layer of insulation material. In addition, the gate of select transistor 340 has sidewalls, and interpoly dielectric 354 formed in the sidewalls.

The advantage of the method of the present invention is that, as shown in FIG. 3G, the step height of select gate 340 is substantially the same as the step height of stacked gate 350. The layers of material which form select gate 340 and stacked gate 350 are substantially the same with the exception that the poly-2 layer 330 under nitride layer 318 is slightly thinner than poly-1 layer 314, and tunnel oxide layer 312 is slightly thinner that gate oxide layer 326. As a result, the etch step that initially defines select gate 340 and stacked gate 350 can be performed without trenching the substrate as is the case with conventional methods.

Figure 4:
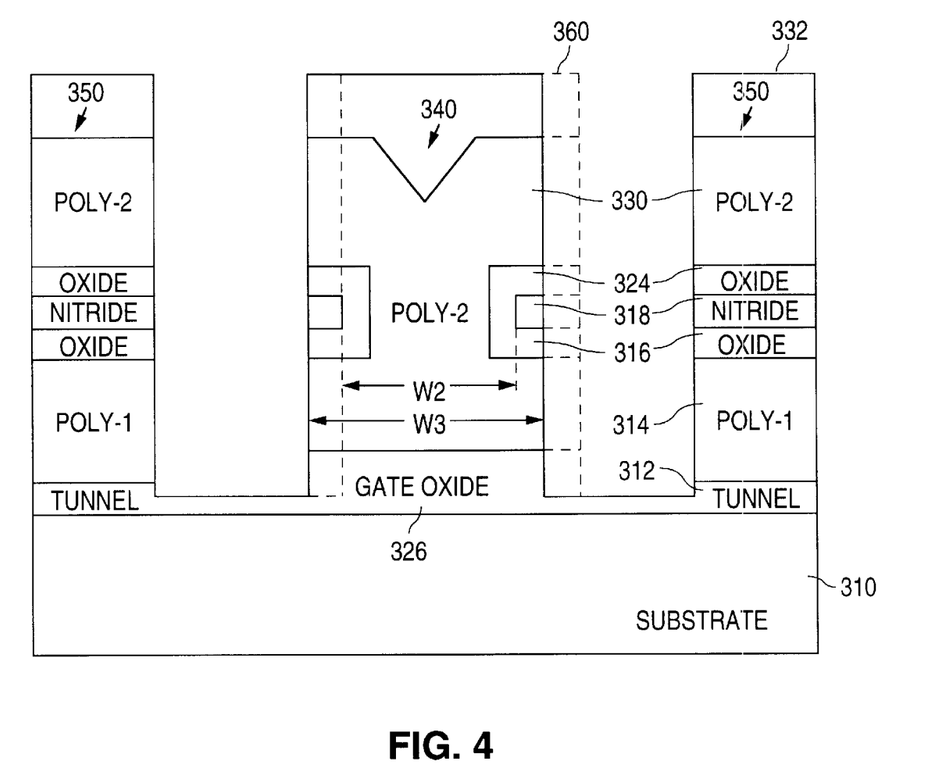
FIG. 4 is a cross-sectional diagram illustrating the maximum and minimum spacing between the layer of nitride in accordance with the present invention.

FIG. 4 shows a cross-sectional diagram that illustrates the maximum and minimum spacing between the layer of nitride in accordance with the present invention. FIG. 4 is similar to FIGS. 3F and 3G and, as a result, utilizes the same reference numerals to designate the structures which are common to both figures.

As shown in FIG. 4, since the last etch step of the above process, which initially defines the select gate and the stacked gate, etches through uniform layers of material prior to etching poly-1 layer 314, the width W2 between the nitride layers may have a theoretical maximum size which is only infinitesimally smaller than the desired width W3 of select gate 340.

Practically, however, the width W2 must be reduced from the theoretical maximum to compensate for misalignment errors in the placement of second mask 334 as shown by a misaligned mask 360. (To prevent an etch from etching around the end of nitride layer 318, width W2 may also need to compensate for etch rate differences between the nitride and oxide).

The width W2 may have a minimum size which need only be large enough to allow sufficient lateral etching (see the etch step in FIG. 3C), and large enough to allow poly-2 layer 330 to fill up cavity 322 (see FIG. 3E) without forming excessive voids.

Turning again to FIG. 3C, the minimum width W1 of cavity 322 must be the desired width W3 of select gate 340 plus the thickness of the oxide formed on the sidewalls of poly-1 layer 314 plus the misalignment error. This will insure that the last etch step of the above process will remove the oxide formed on the sidewalls of poly-1 layer 314.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A method for forming a memory cell on a semiconductor material of a first conductivity type, the semiconductor material having a top surface, the method comprising the steps of:

forming a layered structure on the semiconductor material, the layered structure including a first layer or insulation material formed on the semiconductor material, a first layer of conductive material formed on the first layer of insulation material, and a first portion of an interpoly dielectric layer formed on the first layer of conductive material, the first layer of insulation material having a top surface;

forming an opening in the layered structure by removing a first portion of the layered structure, the opening having a width and exposing the first layer of conductive material;

forming a cavity in the layered structure by removing a second portion of the layered structure, the second portion of the layered structure including a portion of the first layer of conductive material, the cavity having a bottom surface and a width which is greater than the width of the opening;

forming a second portion of the interpoly dielectric layer on the first portion of the interpoly dielectric layer;

forming a second layer of insulation material on the bottom surface of the cavity, the second layer of insulation material having a top surface and a thickness such that a distance from the top surface of the semiconductor material to the top surface of the second layer of insulation material is greater than a distance from the top surface of the semiconductor material to the top surface of the first layer of insulation material;

forming a second layer of conductive material on the second portion of the interpoly dielectric layer and the second layer of insulation material, the second layer of conductive material extending through the opening and filling up the cavity; and selectively removing portions of the second layer of conductive material, the second portion of the interpoly dielectric layer, and the layered structure.

2. The method of claim 1 wherein the forming a layered structure step includes:

forming the first layer of insulation material on the semiconductor material;

forming the first layer of conductive material on the first layer of insulation material;

forming a first layer of dielectric material on the first layer of conductive material; and forming a second layer of dielectric material on the first layer of dielectric material.

3. The method of claim 2 wherein the forming an opening step includes:

forming a first mask on the second layer of dielectric material;

patterning the first mask to define an unmasked area on the surface of the second layer of dielectric material, the unmasked area defining a first area on the surface of the first layer of insulation material; and etching the unmasked area of the second layer of dielectric material, the first layer of dielectric material, and the first layer of conductive material until the first layer of conductive material has been completely removed from the first area on the surface of the layer of insulation material to form an opening, the opening forming exposed regions of the first layer of conductive material.

4. The method of claim 3 wherein the forming a cavity step includes the step of laterally etching the exposed regions of the first layer of conductive material.

5. The method of claim 4 wherein the forming a cavity step further includes the step of removing the first layer of insulation material from the bottom surface of the cavity.

6. The method of claim 4 wherein the forming a second portion step includes the step of forming a third layer of dielectric material on the second layer of dielectric material.

7. The method of claim 6 wherein the selectively removing step includes the steps of:

forming a second mask on the second layer of conductive material;

patterning the second mask to define a plurality of unmasked areas on the surface of the second layer of conductive material, the unmasked areas defining a plurality of second areas on the surface of the first layer of insulation material; and etching the unmasked areas of the second layer of conductive material, the third layer of dielectric material, the second layer of dielectric material, the first layer of dielectric material, and the first layer of conductive material until the first layer of conductive material has been completely removed from the second areas on the surface of the first layer of insulation material.

8. The method of claim 1 wherein the first layer of insulation material includes tunnel oxide.

9. The method of claim 1 wherein the second layer of insulation material includes gate oxide.

10. The method of claim 6 wherein the first and third layers of dielectric material include an oxide.

11. The method of claim 1 wherein the second layer of dielectric material includes nitride.

12. The method of claim 1 wherein the first layer of conductive material includes polysilicon.

13. The method of claim 1 wherein the second layer of conductive material includes polysilicon.

14. The method of claim 1 wherein the second layer of conductive material includes polysilicon and an overlying layer of metal silicide.

15. A method for forming a memory cell on a semiconductor material of a first conductivity type, the method comprising the steps of:

forming a first layer of insulation material on the semiconductor material;

forming a first layer of conductive material on the first layer of insulation material;

forming a first layer of dielectric material on the first layer of conductive material;

forming a second layer of dielectric material on the first layer of dielectric material;

forming a first mask on the second layer of dielectric material;

patterning the first mask to define an unmasked area on the surface of the second layer of dielectric material, the unmasked area defining a first area on the surface of the first layer of insulation material;

etching the unmasked area of the second layer of dielectric material, the first layer of dielectric material, and the first layer of conductive material until the first layer of conductive material has been completely removed from the first area on the surface of the first layer of insulation material to form an opening, the opening forming exposed regions of the first layer of conductive material;

laterally etching the exposed regions of the first layer of conductive material to form a cavity;

removing the first layer of insulation material from the bottom surface of the cavity;

forming a third layer of dielectric material on the second layer of dielectric material;

forming a second layer of insulation material on the semiconductor material on the bottom surface of the cavity;

forming a second layer of conductive material over the third layer of dielectric material, and the second layer of insulation material to fill up the cavity;

forming a second mask on the second layer of conductive material;

patterning the second mask to define a plurality of unmasked areas on the surface of the second layer of conductive material, the unmasked areas defining a plurality of second areas on the surface of the first layer of insulation material; and etching the unmasked areas of the second layer of conductive material, the third layer of dielectric material, the second layer of dielectric material, the first layer of dielectric material, and the first layer of conductive material until the first layer of conductive material has been completely removed from the second areas on the surface of the first layer of insulation material.

16. The method of claim 15 wherein the first layer of insulation material includes tunnel oxide.

17. The method of claim 15 wherein the second layer of insulation material includes gate oxide.

* * * * *

UNITED STATES PATENT AND TRADEMARK OFFICE
CERTIFICATE OF CORRECTION

PATENT NO. : 6,362,050 B2
DATED : March 26, 2002
INVENTOR(S) : Alexander Kalnitsky et al.

It is certified that error appears in the above-identified patent and that said Letters Patent is hereby corrected as shown below:

<u>Column 6,</u>
Line 61, delete "or" and replace with -- of --.

Signed and Sealed this

Fourth Day of June, 2002

Attest:

JAMES E. ROGAN
Attesting Officer     Director of the United States Patent and Trademark Office